US008878581B2

(12) United States Patent
Kris

(10) Patent No.: US 8,878,581 B2
(45) Date of Patent: *Nov. 4, 2014

(54) VARIABLE FREQUENCY RATIOMETRIC MULTIPHASE PULSE WIDTH MODULATION GENERATION

(71) Applicant: Microchip Technology Incorporated, Chandler, AZ (US)

(72) Inventor: Bryan Kris, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/165,222

(22) Filed: Jan. 27, 2014

(65) Prior Publication Data
US 2014/0139278 A1    May 22, 2014

Related U.S. Application Data

(63) Continuation of application No. 13/248,271, filed on Sep. 29, 2011, now Pat. No. 8,638,151.

(51) Int. Cl.
*H03K 3/017* (2006.01)
*G06F 1/04* (2006.01)
*H03K 7/08* (2006.01)
*G06F 1/26* (2006.01)

(52) U.S. Cl.
CPC .. *H03K 7/08* (2013.01); *G06F 1/04* (2013.01); *G06F 1/26* (2013.01)
USPC ............. 327/172; 327/160; 327/31; 332/112

(58) Field of Classification Search
USPC ......... 327/172, 174, 175, 141, 142, 231, 232, 327/31; 332/112–114, 118
See application file for complete search history.

(56) References Cited

U.S. PATENT DOCUMENTS

| 4,605,962 | A | * | 8/1986 | Christopher et al. | 348/448 |
|---|---|---|---|---|---|
| 5,172,115 | A | | 12/1992 | Kerth et al. | 341/118 |
| 6,281,822 | B1 | * | 8/2001 | Park | 341/144 |
| 6,658,583 | B1 | | 12/2003 | Kudo et al. | 713/500 |
| 6,915,318 | B2 | * | 7/2005 | Mueller | 708/290 |
| 7,791,386 | B2 | * | 9/2010 | Kris | 327/160 |
| 8,638,151 | B2 | | 1/2014 | Kris | 327/172 |
| 2002/0048318 | A1 | * | 4/2002 | Zhang et al. | 375/237 |
| 2009/0002043 | A1 | | 1/2009 | Kris | 327/175 |

OTHER PUBLICATIONS

International Search Report and Written Opinion, Application No. PCT/US2012/055897, 9 pages, May 24, 2013.

* cited by examiner

*Primary Examiner* — Lincoln Donovan
*Assistant Examiner* — Thomas Skibinski
(74) *Attorney, Agent, or Firm* — King & Spalding L.L.P.

(57) ABSTRACT

Groups of phase shifted Pulse Width Modulation signals are generated that maintain their duty-cycle and phase relationships as a function of the period of the PWM signal frequency. The multiphase PWM signals are generated in a ratio-metric fashion so as to greatly simplify and reduce the computational workload for a processor used in a PWM system. The groups of phase shifted PWM signals may also be synchronized with and automatically scaled to match external synchronization signals.

18 Claims, 11 Drawing Sheets

VARIABLE FREQUENCY RATIOMETRIC MULTIPHASE PULSE WIDTH MODULATION GENERATION

CROSS-REFERENCED TO RELATED APPLICATIONS

This application is a continuation of U.S. patent application Ser. No. 13/248,271 filed on Sep. 29, 2011, now U.S. Pat. No. 8,638,151 issued on Jan. 28, 2014, the contents of which are hereby incorporated by reference in their entirety.

TECHNICAL FIELD

The present disclosure relates generally to generation of pulse width modulation signals, and more particularly to the generation of a group of pulse width modulation signals that maintain a phase relationship over a range of frequencies.

BACKGROUND

Power conversion applications are becoming increasingly more sophisticated to improve their power conversion efficiencies, for example, by using arrays of pulse width modulation (PWM) signal outputs that are frequency variable and phase shifted relative to each other. This PWM signal combination is often used in resonant switch mode power conversion circuits to improve power conversion efficiency thereof. Present technology multiphase, variable frequency PWM generation circuits function with specific time durations for period, phase offset and duty cycle. As the PWM pulse frequency is varied, the values of the aforementioned PWM parameters must be recalculated and updated for each PWM cycle that requires a lot of processing power and speed to perform the required calculations. These phase shifted PWM signals also may be synchronized to external synchronization signals. However, synchronization can create problems if the sync signal period and/or phase varies widely, e.g., runt pulses, missing cycles, runaway duty cycles, etc.

When using analog PWM signal generation it is difficult to generate multi-phase PWM signals that operate over a wide frequency range, and present technology standard digital PWM signal generation operates at a fixed frequency that is not suitable for variable frequency operation.

SUMMARY

It is desired to be able to generate groups of phase shifted PWM signals that maintain their duty-cycle and phase relationships as a function of the period of the PWM signal frequency. Therefore, there is a need for the ability to generate multiphase PWM control signals that behave in a ratio-metric fashion so as to greatly simplify and reduce the computational workload for a processor used in a PWM system. Frequency scaling should be able to use a fixed clock frequency to permit easy integration into a digital processing, e.g., microcontroller, system. It is also desired to be able to accurately and reliably synchronize groups of phase shifted PWM signals to external synchronization signals without creating the aforementioned problems.

According to the teachings of this disclosure, "stutter" clocking/counting is implemented with a circuit that periodically deletes (skips) clock pulses to the PWM generation circuits, based upon an accumulator circuit, or a circuit that periodically inhibits counting by the PWM counters based upon an accumulator circuit. The missing clock pulses or missing counts cause the time-base(s) of the PWM generation circuit(s) to operate slower, thus lowering the effective PWM frequency. By varying the rate of clock pulses/counts to the PWM generators, the frequency of the resultant PWM outputs is varied, and the phase offsets and duty are also varied in proportion (ratio-metrically). However, one drawback to this type of "stutter" clocking/counting is that the scale factor must be reduced to increase the PWM period, duty cycle, phase, etc. This inverse relationship is undesirable.

The aforementioned drawback can be overcome by using a programmable modulo arithmetic to generate a stream of count enable pulses to the PWM generation logic. The count enable signal's logic "1" to logic "0" ratio determines the amount of time base scaling for the associated PWM generation circuits. As compared to an "accumulator" based scaling for the associated PWM generation circuits, this embodiment does not use a fixed roll-over count value which is typically "all logic 1s."

The aforementioned accumulator method of scaling requires that the scale factor increase in value to reduce the PWM time period. Instead of using an accumulator that "rolls-over," the content of the accumulator is compared to a second scaling value. When the content of the accumulator exceeds this second scaling value, the content of the accumulator is reduced by the second scaling value and a time base "count enable" is generated (produced). This operation is similar to performing division by successive subtraction. By using a programmable accumulator threshold, the need for divide computations are eliminated. Automatic capture of a sync signal time period can also allow automatic scaling of the PWM generation to match the external sync signal. Thus, wildly distorted PWM signals will be eliminated.

According to a specific example embodiment of this disclosure, an apparatus for controlling a variable frequency ratio-metric pulse width clock signal comprises: a subtractor (758) having sign output used to generate a count enable signal (772), wherein the count enable signal (772) is asserted when a first value at a first input is equal to or greater than a second value at a second input of the subtractor (758); an accumulator (764) having a clock input coupled to a clock signal comprising a plurality of clock pulses at a certain frequency; an adder (766) having an output coupled to an input of the accumulator (764); a multiplexer (768) having an output coupled to a second input of the adder (766); a first input coupled to an output of the accumulator (764), a second input coupled to a difference output of the subtractor (758), and a control input coupled to the sign output of the subtractor (758); a numerator register (770) having an output coupled to a first input of the adder (766), wherein the numerator register (770) stores a numerator value; and a denominator register (762) having an output coupled to the second input of the subtractor (758), wherein the denominator register (762) stores a denominator value; wherein the numerator value is added to a value in the accumulator (764) at each clock pulse until the subtractor (758) determines that the value in the accumulator (764) is equal to or greater than the denominator value in the denominator register (762) then a resultant difference from the output of the subtractor (758) is subtracted from the value in the accumulator (764), whereby the value in the accumulator (764) remains between zero (0) and the value in the denominator register (762).

According to another specific example embodiment of this disclosure, a system for generating a plurality of variable frequency ratio-metric pulse width modulation (PWM) signals comprises: a stutter clock circuit (300), wherein the stutter clock circuit (300) comprises: a subtractor (758) having a sign output used to generate a count enable signal (772), wherein the count enable signal (772) is asserted when a first value at a first input is equal to or greater than a second value at a second input of the subtractor (758); an accumulator (764) having a clock input coupled to a clock signal comprising a plurality of clock pulses at a certain frequency; an adder (766) having an output coupled to an input of the accumulator (764); a multiplexer (768) having an output coupled to a second input of the adder (766); a first input coupled to an output of the accumulator (764), a second input coupled to a difference output of the subtractor (758), and a control input coupled to the sign output of the subtractor (758); a numerator register (770) having an output coupled to a first input of the adder (766), wherein the numerator register (770) stores a numerator value; and a denominator register (762) having an output coupled to the second input of the subtractor (758), wherein the denominator register (762) stores a denominator value; wherein the numerator value is added to a value in the accumulator (764) at each clock pulse until the subtractor (758) determines that the value in the accumulator (764) is equal to or greater than the denominator value in the denominator register (762) then a resultant difference from the output of the subtractor (758) is subtracted from the value in the accumulator (764), whereby the value in the accumulator (764) remains between zero (0) and the value in the denominator register (762); a master time base generator (800), wherein the master time base generator (800) comprises: a master period register (756) storing a master period value; a master period counter (746) having a clock input coupled to the clock signal, and incrementing a master count value for each of the plurality of clock pulses received; a master period comparator (754) coupled to the master period register (756) and the master period counter (746), wherein the master period comparator (754) compares the master count value to the master period value, generates a PWM end of cycle signal when the master count value is equal to or greater than the master period value, and then resets the master count value in the master period counter (746) to zero; and a plurality of PWM generators (101) for generating a plurality of variable frequency ratio-metric PWM signals, each of the plurality of PWM generators (101) comprises: a duty cycle register (108) storing a duty cycle value; a duty cycle counter (102) having a clock input coupled to the clock signal, a clock enable input coupled to the count enable signal (772), wherein a duty cycle count value is incremented for each of the plurality of clock pulses received when the count enable signal (772) is asserted; a duty cycle comparator (110) coupled to the duty cycle register (108) and the duty cycle counter (102), wherein the duty cycle comparator (110) compares the duty cycle count value to the duty cycle value, and generates a phase offset related PWM signal when the duty cycle count value is less than or equal to the duty cycle value; and a phase offset register (512) storing a phase offset value and coupled to the duty cycle counter (102), wherein the phase offset value is loaded into the duty cycle counter (102) to become a new duty cycle count value when the PWM load signal is asserted from the master time base (500).

According to another specific example embodiment of this disclosure, a method for controlling variable frequency ratio-metric pulse width modulation (PWM) signals comprises the steps of: defining a maximum count value; providing a scale factor value; clearing an accumulator register to a zero value; adding one (1) to the scale factor value and storing the result in the accumulator register; comparing the result in the accumulator register to the maximum count value, wherein if the result in the accumulator register is less than the maximum count value then returning to the steps of adding one (1) to the scale factor value and storing the result in the accumulator register, and if the result in the accumulator register is equal to or greater than the maximum count value then subtracting the maximum count value from the result in the accumulator register; and asserting a count enable to a PWM generator and returning to the steps of adding one (1) to the scale factor value and storing the result in the accumulator register.

According to still another specific example embodiment of this disclosure, a method for controlling variable frequency ratio-metric pulse width modulation (PWM) signals comprises the steps of: providing a denominator value; providing a numerator value; clearing an accumulator register to a zero value; adding one (1) to a scale factor value and storing the result in the accumulator register; comparing the result in the accumulator register to the maximum count value, wherein if the result in the accumulator register is less than the denominator value then returning to the steps of adding one (1) to the scale factor value and storing the result in the accumulator register, and if the result in the accumulator register is equal to or greater than the denominator value then subtracting the denominator value from the result in the accumulator register; and asserting a count enable to a PWM generator and returning to the steps of adding one (1) to the scale factor value and storing the result in the accumulator register.

BRIEF DESCRIPTION OF THE DRAWINGS

A more complete understanding of the present disclosure thereof may be acquired by referring to the following description taken in conjunction with the accompanying drawings wherein.

Figure 1:
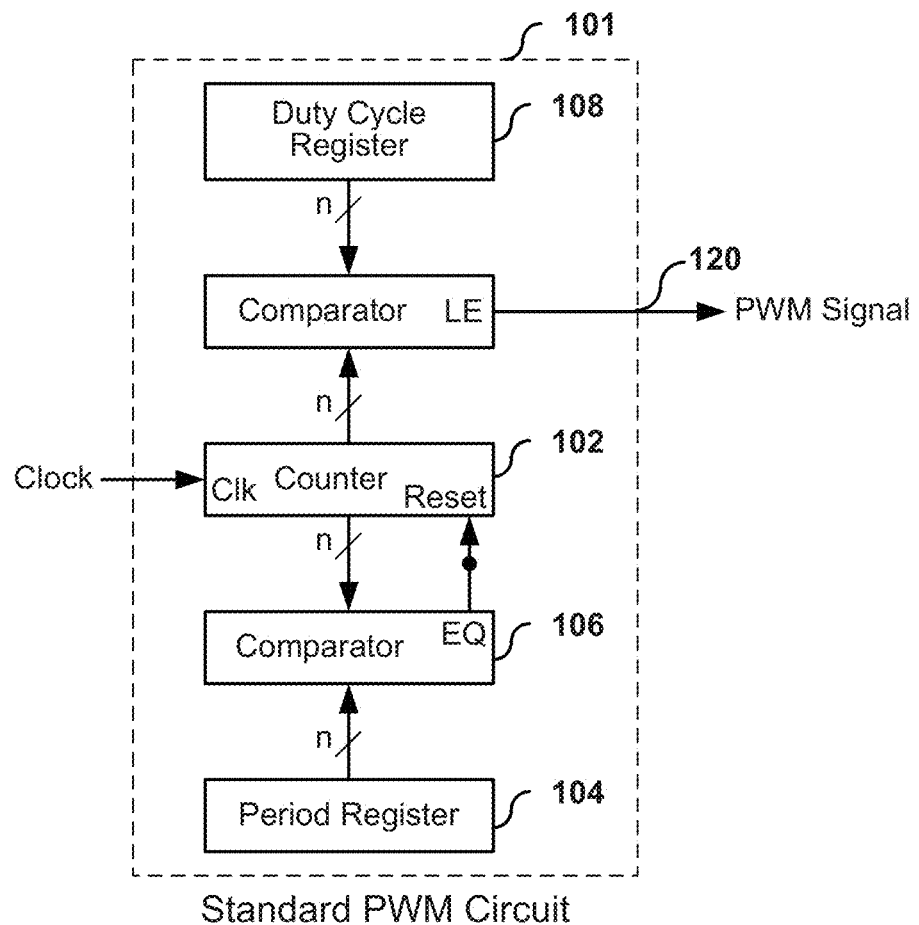
FIG. 1 illustrates a typical pulse width modulation (PWM) generator circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a typical pulse width modulation (PWM) generator circuit. The PWM generator circuit 101 comprises a timer/counter 102, a period register 104, a comparator 106 and a duty cycle register 108. The timer/counter 102 counts up from zero until it reaches a value specified by the period register 104 as determined by the comparator 106. The period register 104 contains a user specified value which represents the maximum counter value that determines the PWM period. When the timer/counter 102 matches the value in the period register 104, the timer/counter 102 is cleared by a reset signal from the comparator 106, and the cycle repeats. The duty cycle register 108 stores the user specified duty cycle value. A PWM output signal 120 is asserted (driven high) whenever the timer/counter 102 value is less than the duty cycle value stored in the duty cycle register 108. The PWM output signal 120 is de-asserted (driven low) when the timer/counter value 102 is greater than or equal to the duty cycle value stored in the duty cycle register 108.

Figure 2:
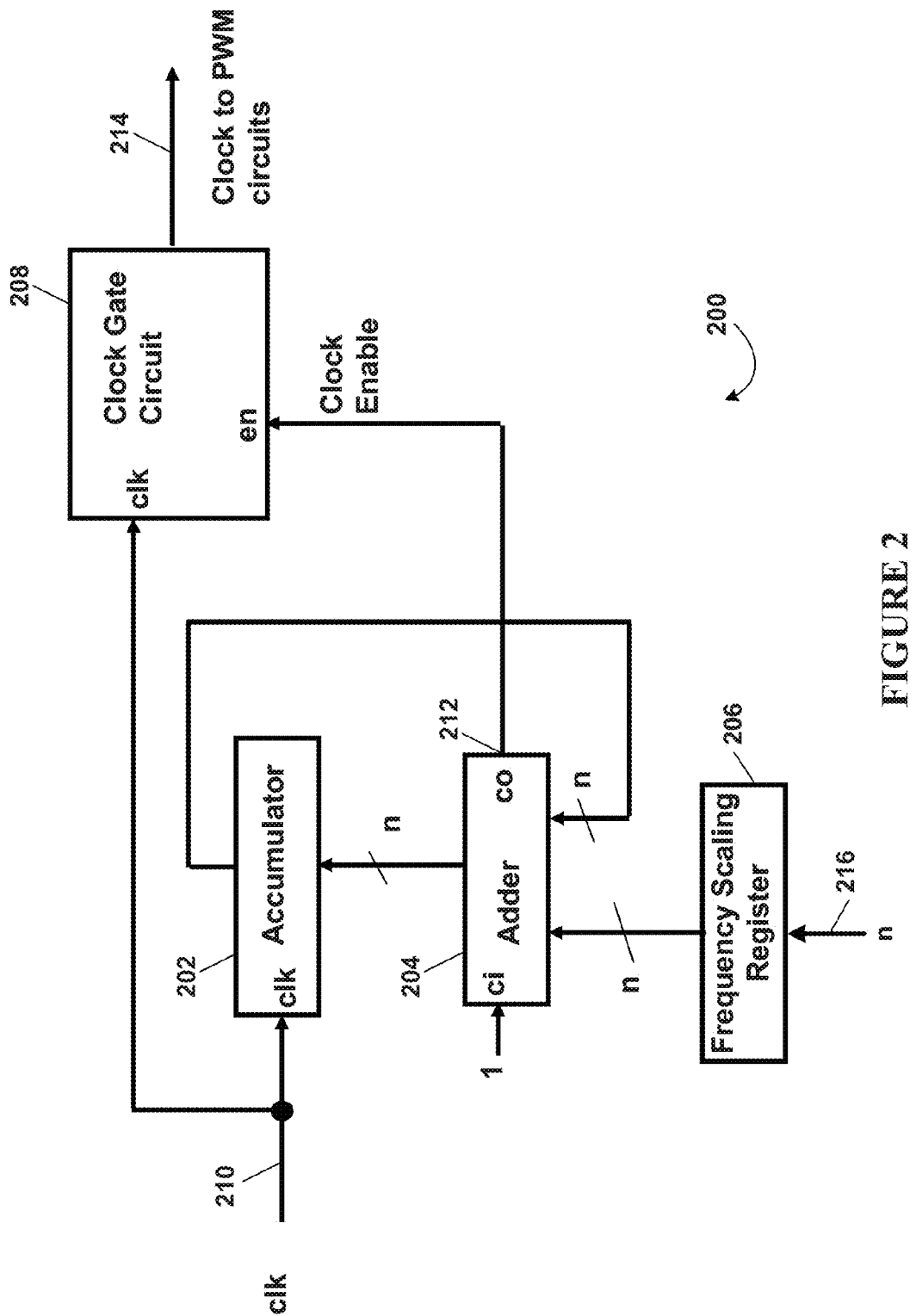
FIG. 2 illustrates a schematic block diagram of a circuit for enabling/disabling clock pulses to PWM counters in PWM generator circuits, according to a specific example embodiment of this disclosure.
Figure 3:
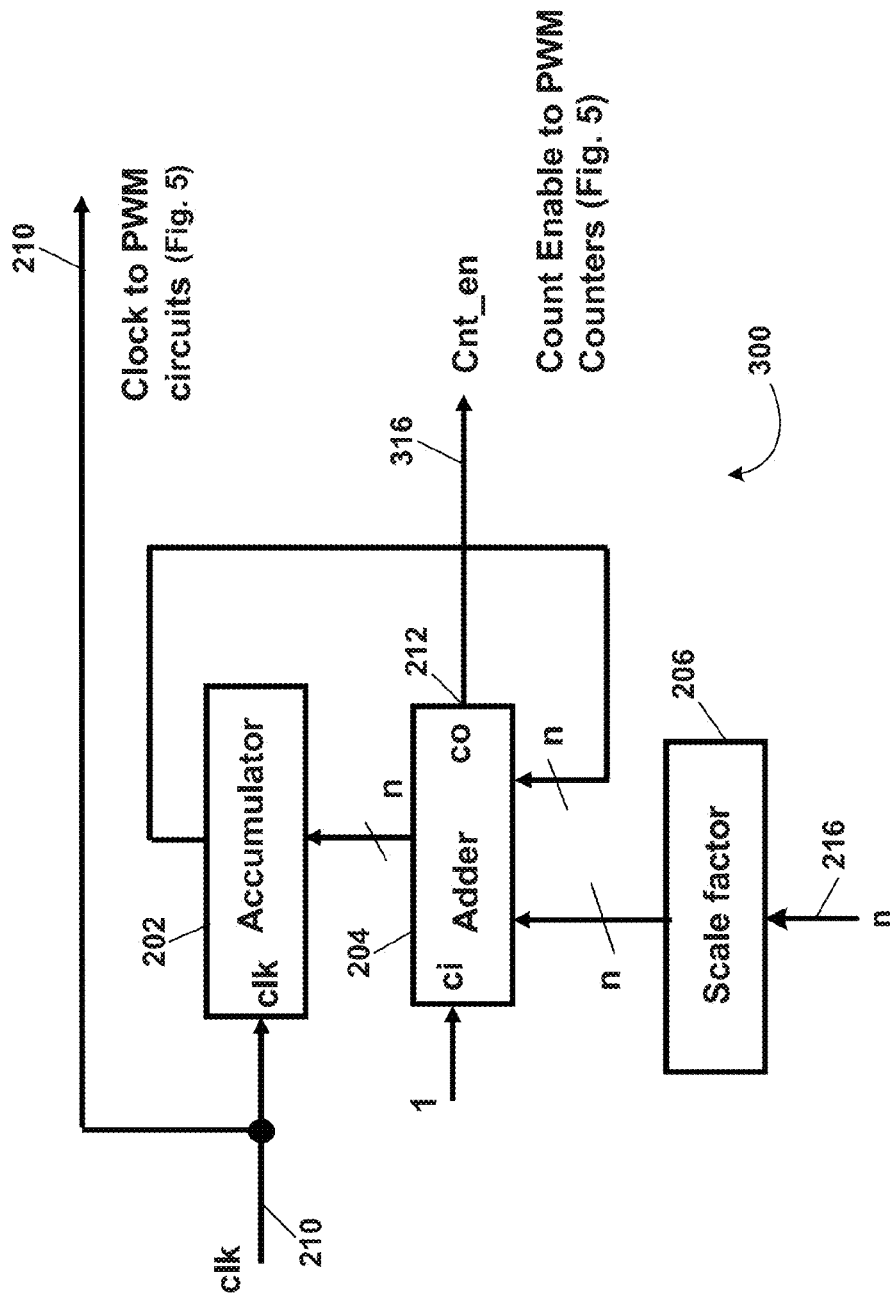
FIG. 3 illustrates a schematic block diagram of a circuit for enabling/disabling PWM counting in PWM generator circuits, according to another specific example embodiment of this disclosure.

Referring to FIGS. 2 and 3, depicted are schematic block diagrams of circuits for enabling/disabling clock pulses to PWM counters (FIG. 2) and enabling/disabling PWM counting (FIG. 3) in PWM generator circuits, according to specific example embodiments of this disclosure. FIGS. 2 and 3 illustrate two similar circuits comprising an accumulator 202, an adder 204 and a frequency scaling register (FSR) 206 having a programmable input 216. On each clock cycle (at input 210), the contents of the FSR 206 is added to the contents in the accumulator 202 with the adder 204. Then this sum overflows in the adder 204 and a carry out (co) signal is generated at node 212. This carry out signal can either be used to enable a clock gating circuit 208 (FIG. 2), or be used as a count enable signal (FIG. 3) to the associated PWM generation circuitry (see FIG. 5). The net result is to operate the PWM circuitry at a slower rate so as to yield lower PWM output signal frequencies.

Figure 4:
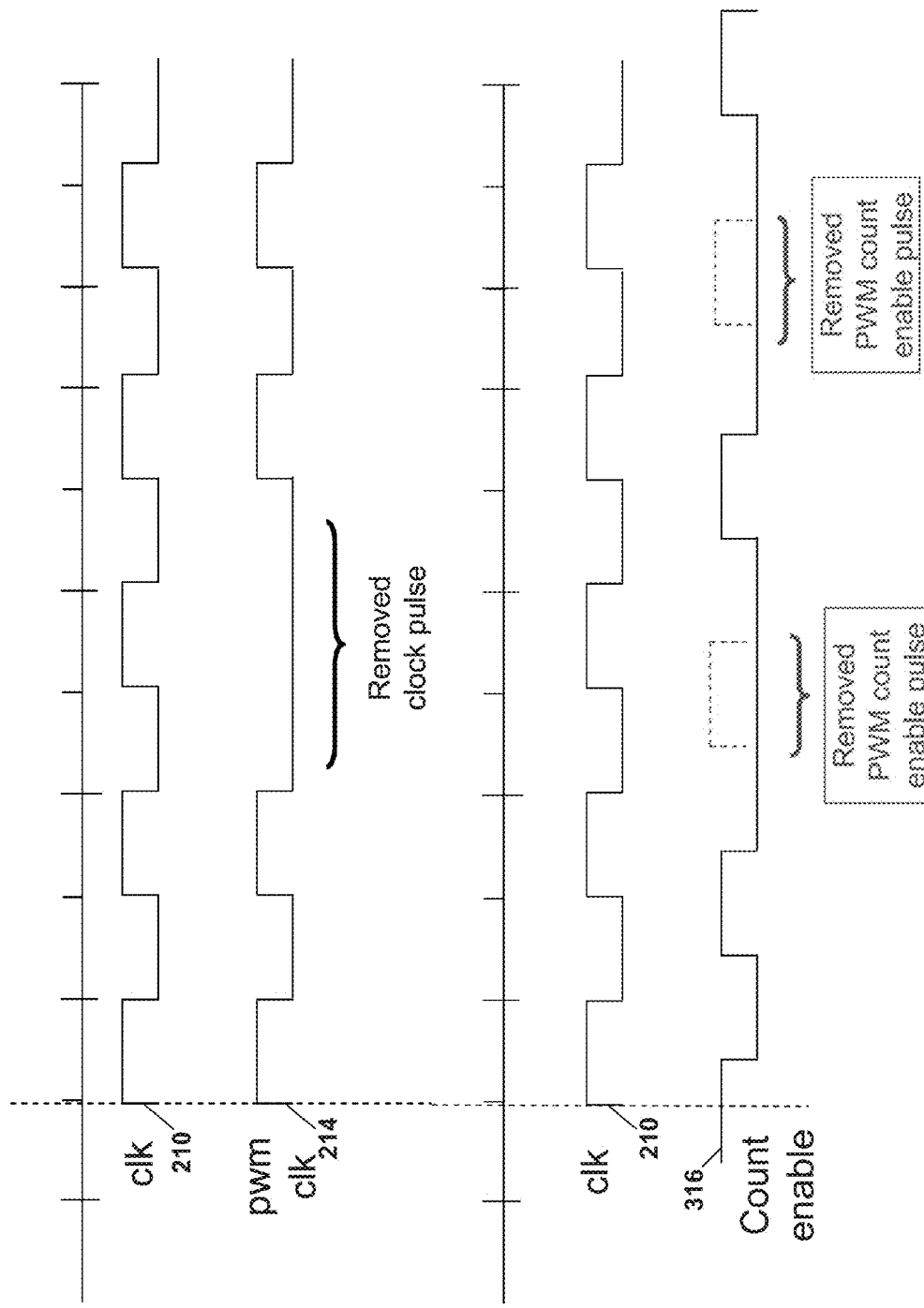
FIG. 4 illustrates schematic timing diagrams for PWM clock/count enabling, according to the teachings of this disclosure.

Referring to FIG. 4, depicted are schematic timing diagrams for PWM clock/count enabling, according to the teachings of this disclosure. The PWM clock 214 has pulses removed from the clock 210 (FIG. 2), and the count enable at node 316 inhibits some of the pulses of the clock 210 (FIG. 3). Either circuit configuration shown in FIG. 2 or 3 accomplishes the same result of lowering the PWM output signal frequency.

Figure 5:
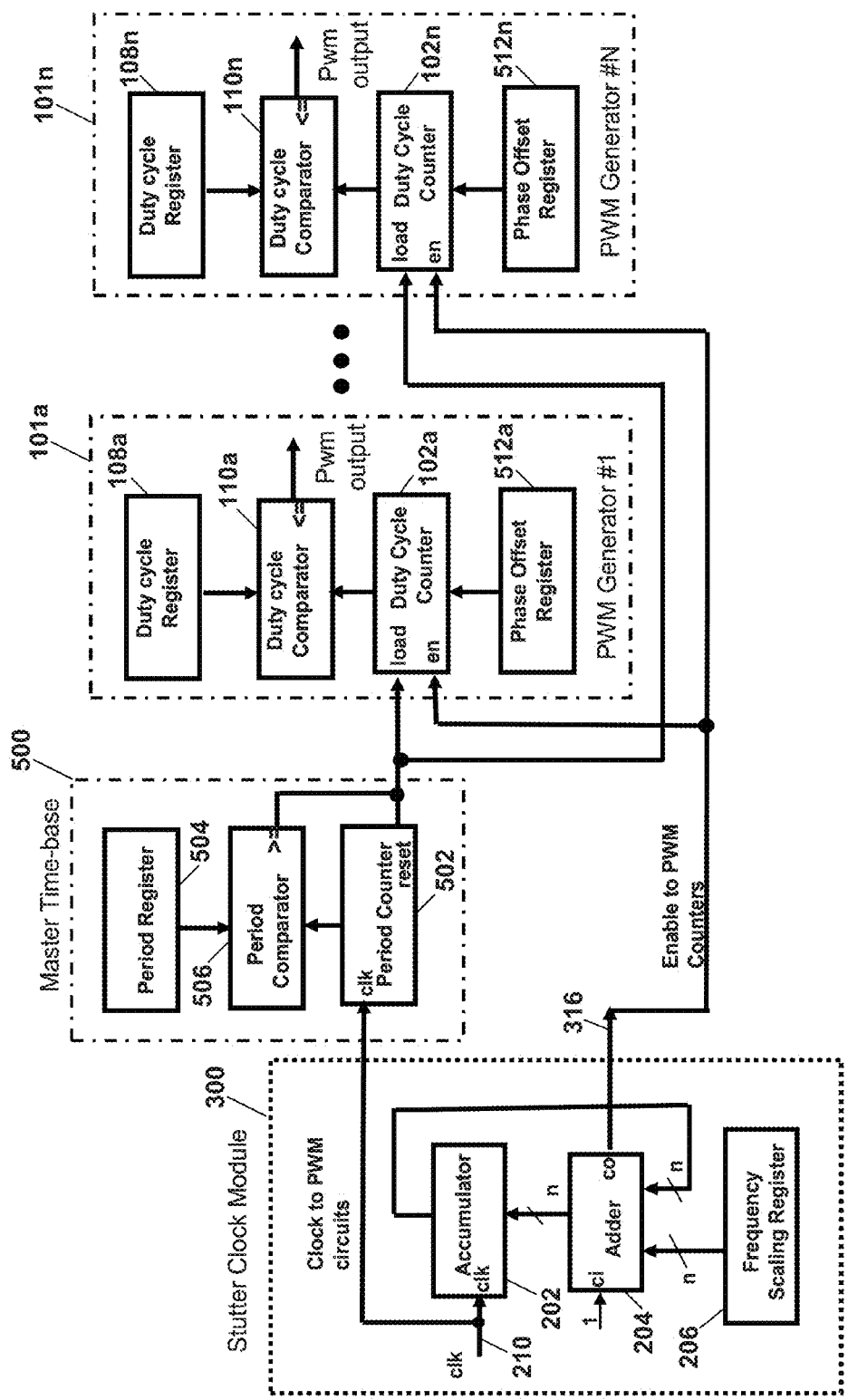
FIG. 5 illustrates a schematic block diagram of a multiphase ratio-metric PWM generation system utilizing the specific example embodiment shown in FIG. 3.

Referring to FIG. 5, depicted is a schematic block diagram of a multiphase ratio-metric PWM generation system utilizing the specific example embodiment shown in FIG. 3. The circuit embodiment shown in FIG. 5 supports generation of multiphase related PWM output signals that maintain their relative relationships as the frequency is varied by the "stutter clock" circuits 200 and 300 shown in FIGS. 2 and 3, respectively. Sutter clock circuit 300 shown but the stutter clock circuit 200 may be used equally effectively.

A master time base 500 comprises a period register 504, period comparator 506 and a period counter 502 that control the period of each of the PWM signal phases from the PWM generators 101a-101n. Each of the PWM generators 101 has a phase offset register 512 that determines the phase offset for the respective PWM output signal from each of the PWM generators 101.

The duty cycle, phase-offset and PWM period registers 108, 512 and 504, respectively, are programmed to values required to obtain the highest desired operating frequency. The frequency scaling register (FSR) 206 is set to the highest possible value, e.g., FFFF (hex) for a 16-bit register. During PWM system operation, the value in the FSR 206 is modified to lower the resultant PWM output frequency. For example, a value of 7FFF (hex) would result in a PWM output frequency of one-half of the value programmed into the period register 504. As the FSR 206 value is varied, the PWM duty cycle and phase offset will vary ratio-metrically to yield a constant "degrees per cycle" for duty cycle and phase offset.

Figure 6:
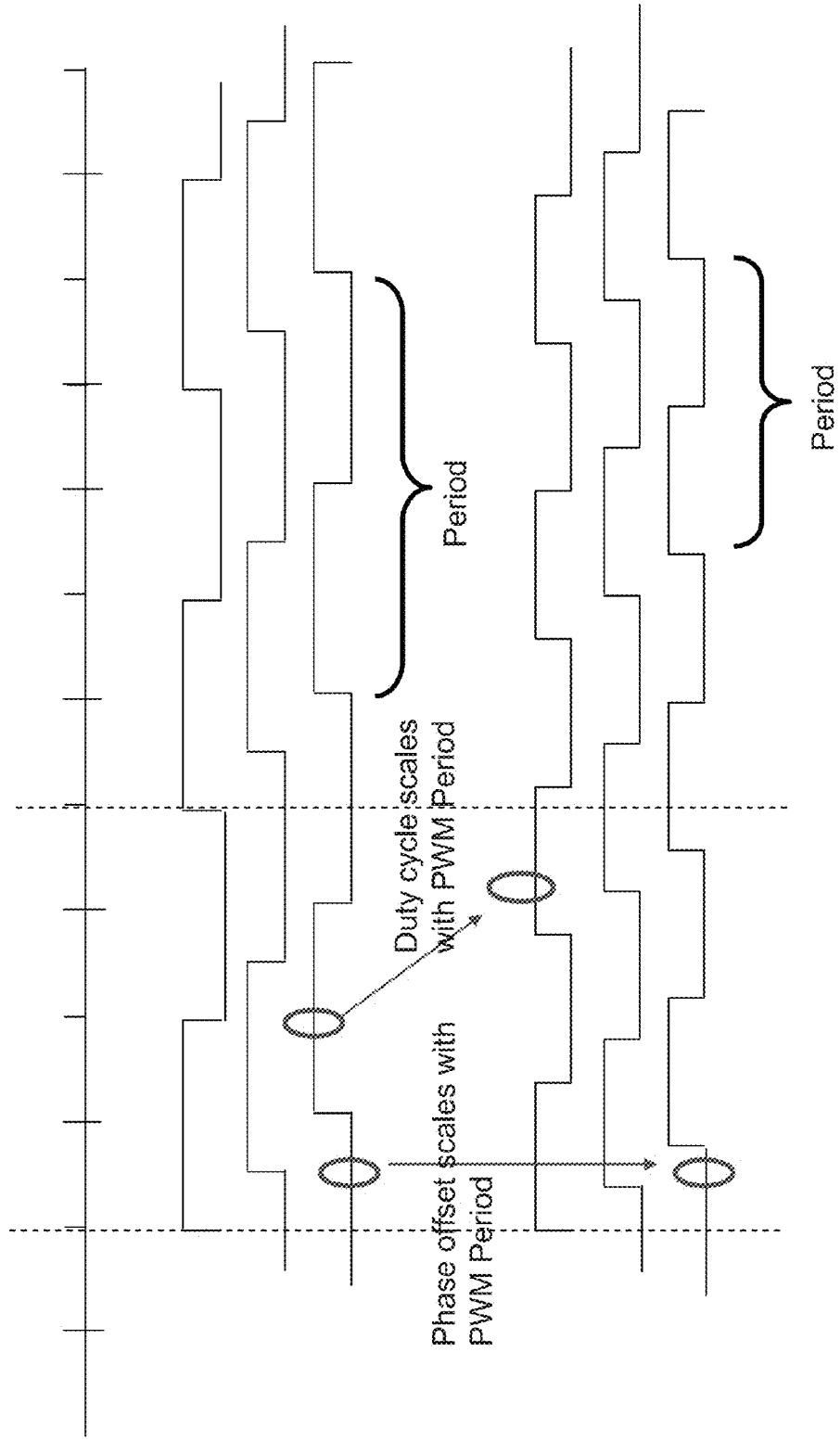
FIG. 6 illustrates schematic timing diagrams for multi-phase PWM generation showing operation at different frequencies, according to the teachings of this disclosure.

Referring to FIG. 6, depicted are schematic timing diagrams for multi-phase PWM generation showing operation at different frequencies, according to the teachings of this disclosure. The top PWM waveforms (three phases shown) represent operation at a lower frequency, and the bottom PWM waveforms (three phases shown) represent operation at a higher frequency. Clearly shown are phase offset and duty cycle scaling proportional to the change in the PWM period.

Figure 7:
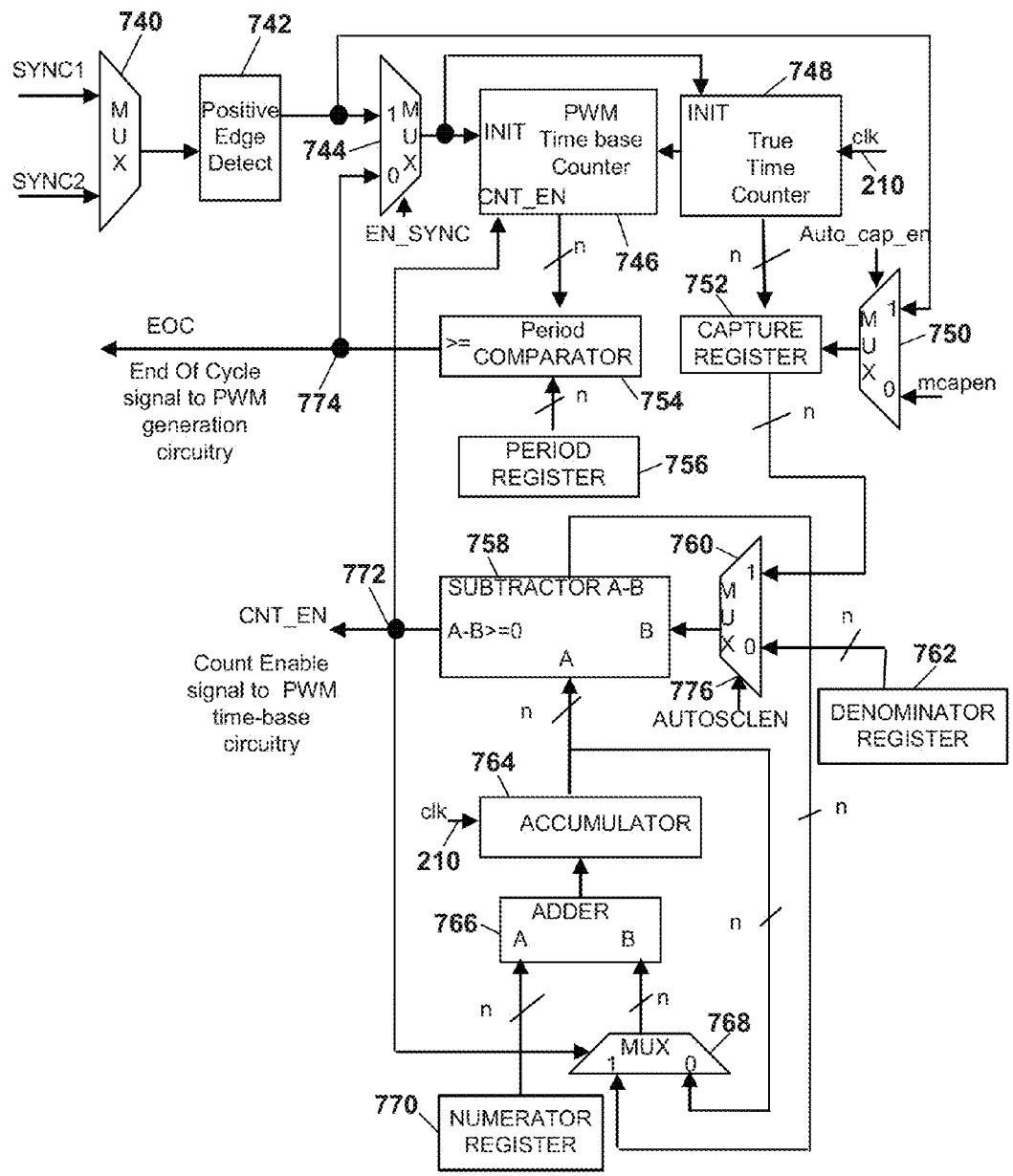
FIG. 7 illustrates a schematic block diagram of a PWM time base having a circuit for enabling/disabling PWM counting in PWM generator circuits, according to yet another specific example embodiment of this disclosure.

Referring to FIG. 7, depicted is a schematic block diagram of a PWM time base having a circuit for enabling/disabling PWM counting in PWM generator circuits, according to yet another specific example embodiment of this disclosure. In this specific example embodiment, a programmable modulo arithmetic circuit, comprising numerator register 770, denominator register 762, accumulator register 764, adder 766 and subtractor 758 are used to implement "stutter counting," according to the teachings of this disclosure. In addition, sync period capture may be used to measure the interval between sync pulses for creating PWM signals that track external sync signals from multiplexer 740 and/or from multiplexer 744 (EOC signal 774). The numerator register 770 is initialized with the shortest PWM period for the application circuit (same as the PWM time base period). The denominator register 762 is loaded with the measured sync pulse period after reception of every sync pulse. The resulting "CNT_EN signal at node 772 is used to stretch the effective time base duration (via stutter counting) to match the sync period.

The value in the numerator register 770 is repeatedly added to the value in the accumulator 764 with the adder 766 when the multiplexer 768 has its "0" input enabled (node 772 at a logic "0"). The summed value in the accumulator 764 increases until the subtractor 758 indicates that the value in the accumulator 764 is greater than the value in the denominator register 762. When the value (limit) in the denominator register 762 is exceeded, this value is subtracted from the value in the accumulator 764, thereby creating a "modulo" result. The accumulator 764 is therefore limited to values between zero and the value in the denominator register 762. Whenever the value in the accumulator 764 is greater than the value in the denominator register 762, the CNT_EN signal at node 772 is at a logic "1." When the CNT_EN signal 772 is at a logic "1," the behavior of the PWM local time base counters 102, shown in FIG. 8, function in the same way as the count enable signal 316 and the duty cycle counters 102, shown in FIG. 5, and described hereinabove.

For example, if the value in the numerator register 770 is one-fourth the value in the denominator register 762, then the CNT_EN signal of logic "1" is asserted at node 772 once every four clock cycles, wherein the PWM local time base counters 102 (FIG. 8), count four times slower than normal, thereby stretching the PWM cycle by a factor of four (4).

Figure 8:
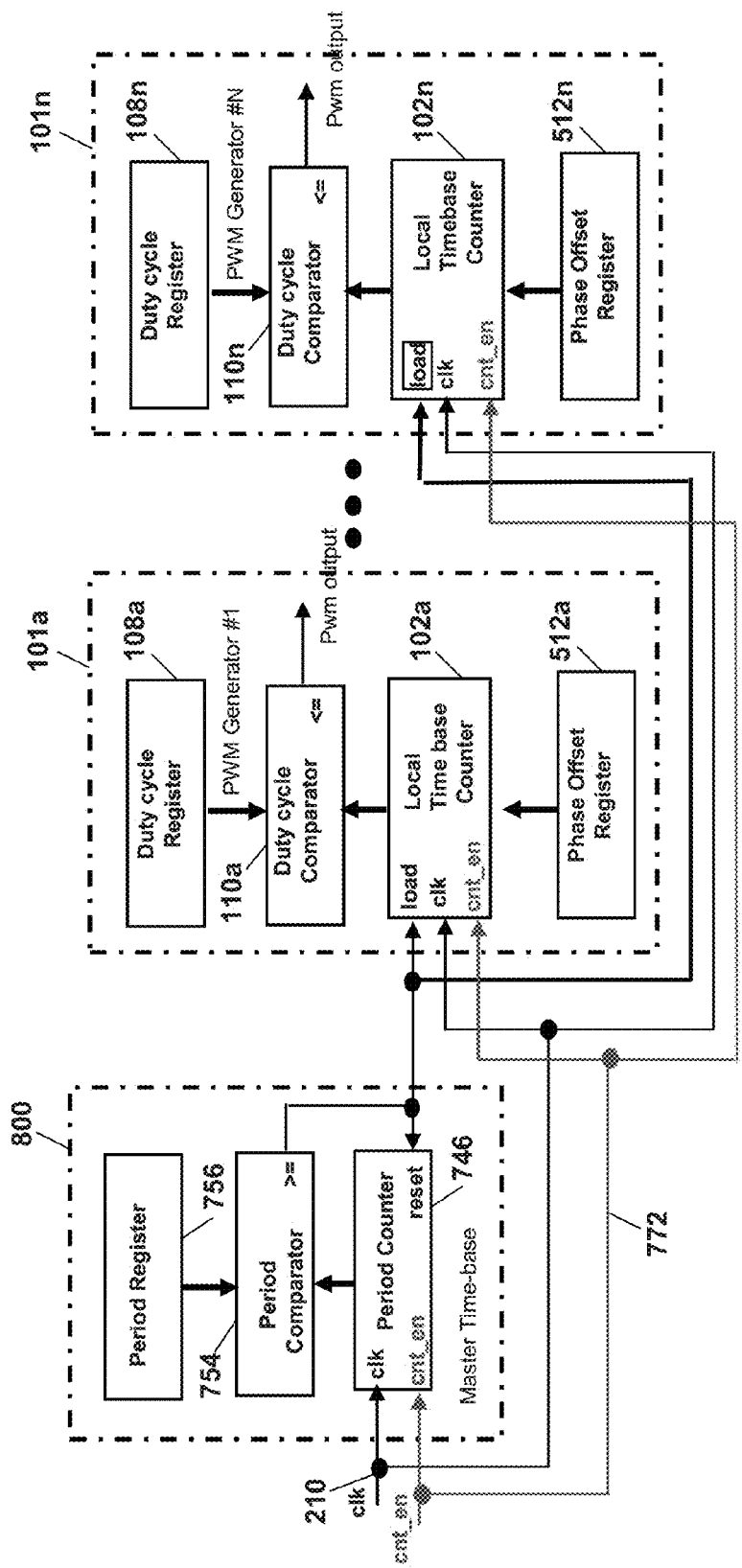
FIG. 8 illustrates a schematic block diagram of a multiphase ratio-metric PWM generation system utilizing the specific example embodiment shown in FIG. 7.

The PWM time base counter 746 provides basic timing used by the PWM generation circuits (see FIG. 8). The counting in the PWM time base counter 746 is controlled by circuits performing the modulo math described above. The true time counter 748 is used to measure the time period between the external sync signal pulses (initiate signal from the output of the multiplexer 744). This time measurement of the time period between the external sync signal pulses is not affected by the modulo math circuit because the true time counter 748 counts every clock cycle (clock 210 directly coupled to the clock input of the true time counter 748). The capture register 752 stores the time period value of the successive sync signals. The value in the capture register 752 may be used as the denominator value instead of the denominator value from the denominator register 762 if selected by the multiplexer 760 that is controlled by the application (user) with the AUTOSCLEN signal at node 776. The AUTOSCLEN signal at node 776 may be derived from a user specified scaling enable bit, e.g., from a digital processor (microcontroller).

The PWM time base counter 746, a true time counter 748, a capture register 752, a period register 756 and logic circuits, e.g., multiplexers 750 and 744, are used to select either an external synch signal or use the internally generated end of cycle (EOC) signal to restart the PWM cycle. For example, the external synch signal is obtained through the multiplexer 740, positive edge detector 742 and the multiplexer 744. Otherwise, the PWM time base counter 746 and period comparator 754 generate the end of cycle (EOC) signal at node 774. Either way, the EOC signal at node 774 restarts the PWM cycle. This allows automatic PWM period scaling that tracks the period of the external synch signal, e.g., SYNC1 or SYNC2. This feature provides a proportional PWM period scaling function.

The true time counter 748 counts at a constant rate that is unaffected by the other operations going on in the circuits shown in FIG. 7. When an external SYNC (SYNC1 or SYNC2) signal is received, the true time counter 748 contents are saved in the capture register 752 and then the true time counter 748 is reset. This constant process provides the time period between the external SYNC input pulses. The result of the capture register 752 may be used in place of the denominator register 762 selected via multiplexer 760. A the circuit counts, the summation value is constantly compared to the contents of the capture register 752 yielding a PWM time base period that follows the external synchronization period. This is all possible because of the proportional PWM period scaling capabilities of the circuits shown in FIG. 7.

Referring to FIG. 8, depicted is a schematic block diagram of a multiphase ratio-metric PWM generation system utilizing the specific example embodiment shown in FIG. 7. A master time base 800 comprises the period register 756, the period comparator 754 and the period counter 746 shown in FIG. 8, and that controls the period of each of the PWM signal phases from the PWM generators 101a-101n. Each of the PWM generators 101 has a phase offset register 512 that determines the phase offset for the respective PWM output signal from each of the PWM generators 101. The duty cycle, phase-offset and PWM period registers 108, 512 and 746, respectively, are programmed to values required to obtain the highest desired operating frequency, and PWM frequency reduction is accomplished with the count enable signal 772 from the circuit shown in FIG. 7.

Figure 9:
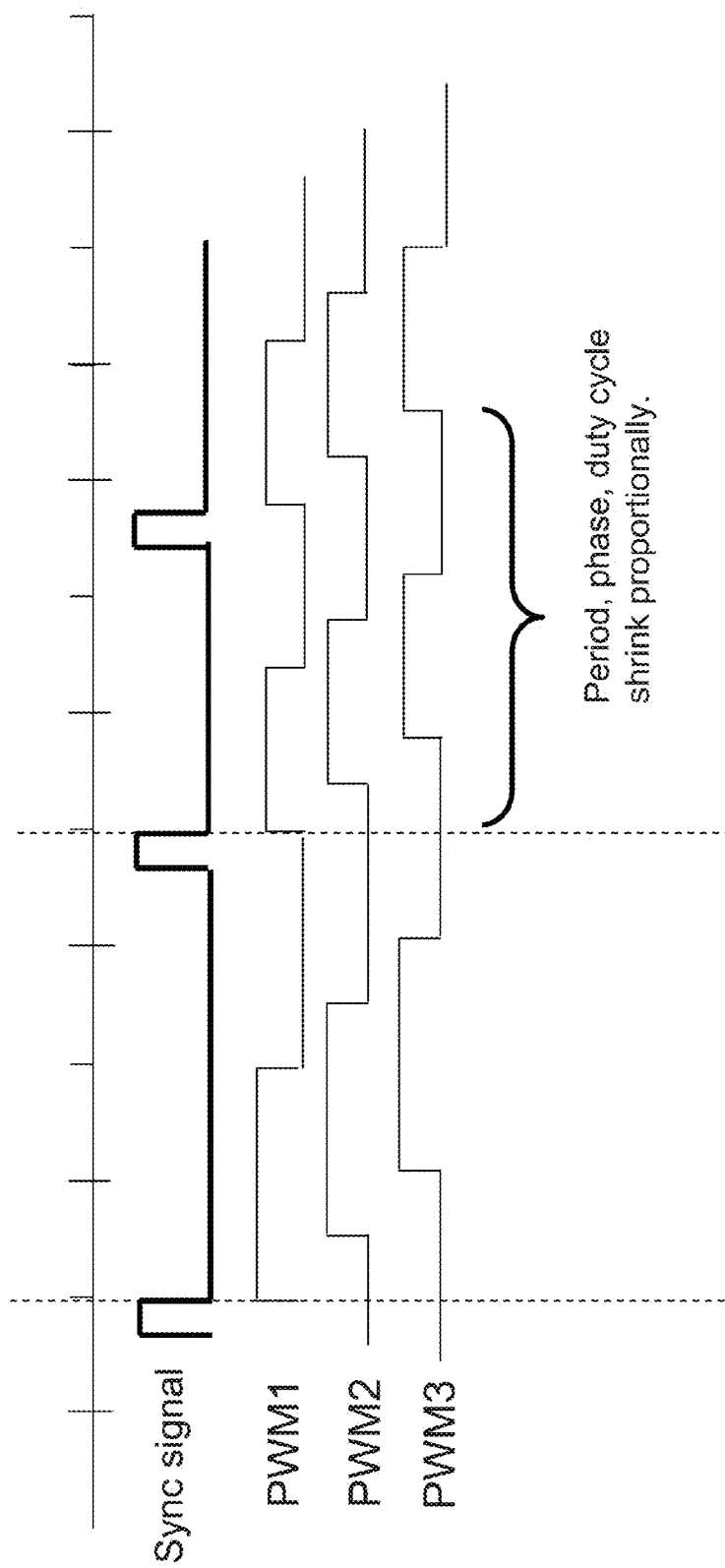
FIG. 9 illustrates schematic timing diagrams for synchronized multi-phase PWM signals of the embodiments shown in FIGS. 5 and 8, according to the teachings of this disclosure.

Referring to FIG. 9, depicted are schematic timing diagrams for synchronized multi-phase PWM signals of the embodiments shown in FIGS. 5 and 8, according to the teachings of this disclosure. The PWM1, PWM2 and PWM3 signals (three phases shown) synchronize on the sync signal as illustrated. When the time between sync signal pulses becomes shorter, so will the PWM period, phase and duty cycle of the PWM1, PWM2 and PWM3 signals shrink proportionally.

Figure 10:
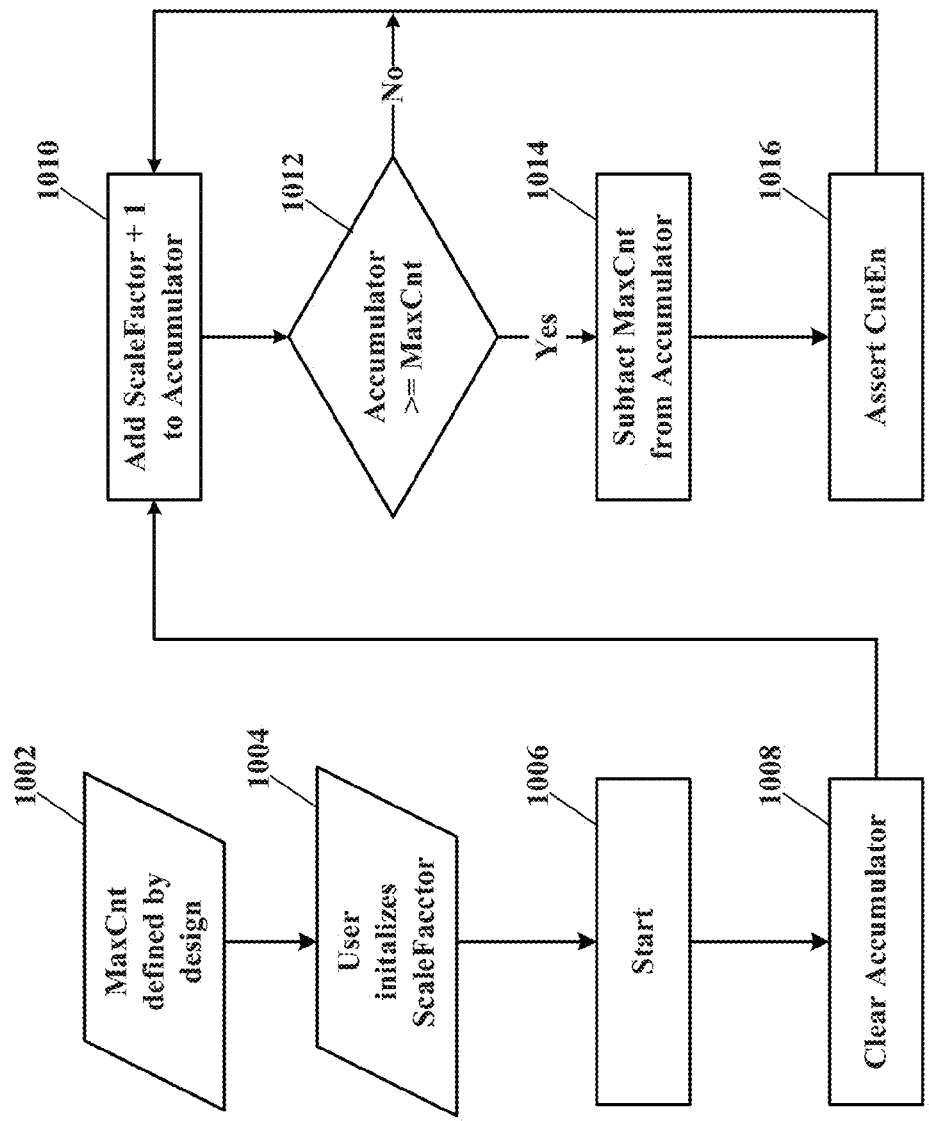
FIG. 10 illustrates an operational flow diagram of the circuits shown in FIGS. 2 and 3.

Referring to FIG. 10, depicted is an operational flow diagram of the circuits shown in FIGS. 2 and 3. In step 1002 a maximum count value is defined by design of the circuit shown in FIG. 2 or 3. In step 1004 a scale factor is loaded into the scale factor register 206. Then in step 1006 the operations described hereinabove start, and in step 1008 the accumulator register 202 is cleared. Then in step 1010 one (1) is added to the scale factor, and in step 1012 the result is compared with the maximum count value. If the result stored in the accumulator register 202 is less than the maximum count value, then in step 1010 one (1) is again added to the scale factor. If the result stored in the accumulator register 202 is equal to or greater than the maximum count value, then the maximum count value is subtracted from count value stored in the accumulator register 202. In step 1016 the count enable is asserted at node 316, and the process continues by returning back to step 1010.

Figure 11:
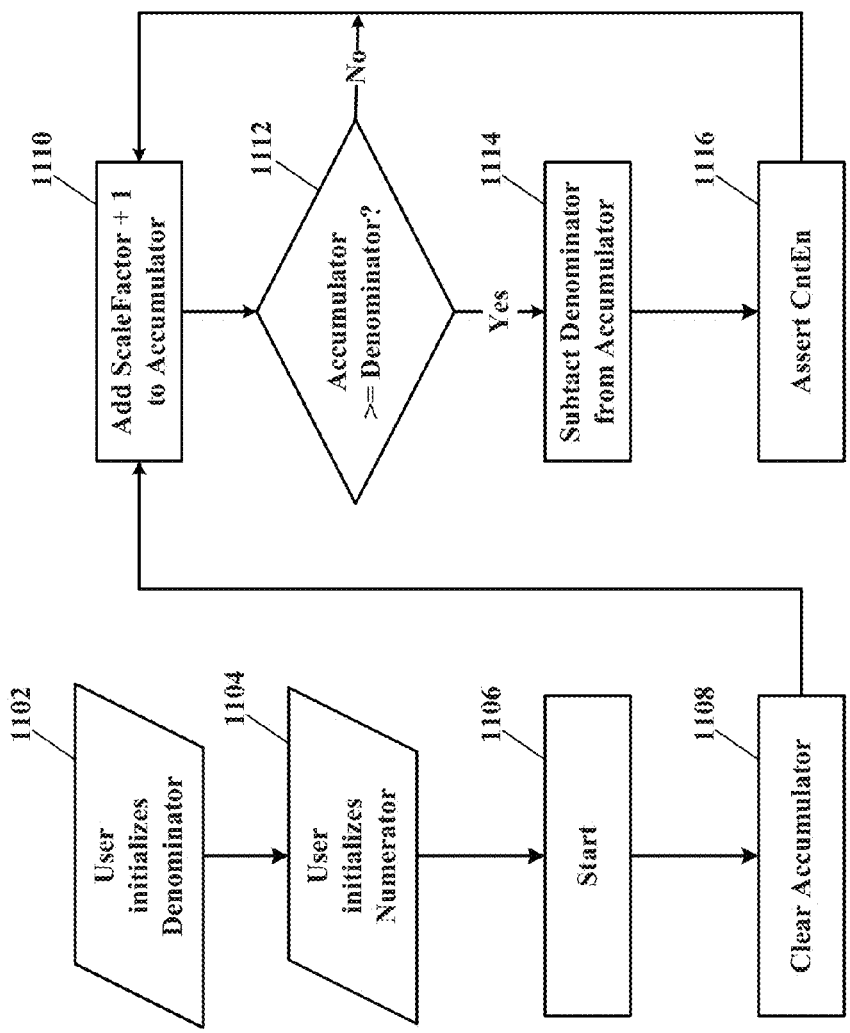
FIG. 11 illustrates an operational flow diagram of the circuit shown in FIG. 7.

Referring to FIG. 11, depicted is an operational flow diagram of the circuit shown in FIG. 7. In step 1102 a denominator value is loaded into the denominator register 762. In step 1104 a numerator value is loaded into the numerator register 770. Then in step 1106 the operations described hereinabove start, and in step 1108 the accumulator register 764 is cleared. Then in step 1110 one (1) is added to the scale factor, and in step 1112 the result is compared with a maximum count value. If the result stored in the accumulator register 764 is less than the maximum count value, then in step 1110 one (1) is again added to the scale factor. If the result stored in the accumulator register 764 is equal to or greater than the maximum count value, then the maximum count value is subtracted from count value stored in the accumulator register 764. In step 1116 the count enable is asserted at node 772, and the process continues by returning back to step 1110.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A pulse width modulation clock control circuit, comprising:
    a clock input receiving a clock signal;
    a clock driven processing unit configured to generate an overflow signal based on a scaling factor, wherein the clock driven processing unit comprises an adder and being configured to add with each clock signal the content of a scaling register with the content of an accumulator, wherein the accumulator receives said clock signal and stores an output value from the adder with each clock pulse, wherein a first input of the adder is coupled with an output of the accumulator and a second input of the adder is coupled with die scaling register and wherein a carry output of the adder provides said overflow signal;

wherein the pulse width modulation clock control circuit is further configured to remove a clock pulse of the clock signal or of a signal based on the clock signal when said overflow signal is generated.

2. The pulse width modulation clock control circuit according to claim 1, wherein
the accumulator comprises:
a clock input coupled to the clock signal comprising a plurality of clock pulses at a certain frequency,
an n-bit input, and
an n-bit output;
the adder comprises:
a carry-in input coupled to a logic high,
a first n-bit input coupled to the n-bit output of the accumulator,
a second n-bit input,
a carry-out output for providing a count enable signal, wherein the count enable is asserted when there is an addition overflow, and
an n-bit output coupled to the n-bit input of the accumulator;
the scaling register comprising:
a programmable n-bit input, and
an n-bit output coupled to the first n-bit input of the adder;
wherein the adder adds a value in the accumulator to a scaling value programmed into the scaling register and outputs a sum thereof back into the accumulator.

3. The pulse width modulation circuit according to claim 1, wherein
the accumulator comprises:
a clock input coupled to the clock signal comprising a plurality of clock pulses at a certain frequency,
an n-bit input, and
an n-bit output;
the adder comprises:
a carry-in input coupled to a logic high,
a first n-bit input coupled to the n-bit output of the accumulator,
a second n-bit input,
a carry-out output for providing the overflow signal, wherein the overflow signal is asserted when there is an addition overflow, and
an n-bit output coupled to the n-bit input of the accumulator,
the scaling register comprises:
a programmable n-bit input, and
an n-bit output coupled to the first n-bit input of the adder,
wherein the adder adds a value in the accumulator to a scaling value programmed into the frequency scaling register and outputs a sum thereof back into the accumulator;
and wherein the pulse width modulation circuit further comprises:
a master time base generator, wherein the master time base generator comprises:
a master period register storing a master period value;
a master period counter having a clock input coupled to the clock signal, and incrementing a master count value for each of the plurality of clock pulses received;
a master period comparator coupled to the master period register and the master period counter, wherein the master period comparator compares the master count value to the master period value, generates a PWM load signal when the master count value is equal to or greater than the master period value, and then resets the master count value in the master period counter to zero; and
a plurality of PWM generators for generating a plurality of variable frequency ratio-metric PWM signals, each of the plurality of PWM generators comprises:
a duty cycle register storing a duty cycle value;
a duty cycle counter having
a clock input coupled to the clock signal,
a clock enable input coupled to the overflow signal,
wherein a duty cycle count value is incremented for each of the plurality of clock pulses received when the overflow signal is asserted;
a duty cycle comparator coupled to the duty cycle register and the duty cycle counter, wherein the duty cycle comparator compares the duty cycle count value to the duty cycle value, and generates a phase offset related PWM signal when the duty cycle count value is less than or equal to the duty cycle value; and
a phase offset register storing a phase offset value and coupled to the duty cycle counter, wherein the phase offset value is loaded into the duty cycle counter to become a new duty cycle count value when the PWM load signal is asserted from the master time base.

4. The pulse width modulation clock control circuit according to claim 1, further comprising a logic gate receiving said clock signal and said overflow signal to output a modified clock signal.

5. A pulse width modulation circuit comprising a pulse width modulation clock control circuit according to claim 4 and further comprising:
at least one pulse width modulation unit comprising a duty cycle counter receiving said modified clock signal, wherein said duty cycle counter increments a duty cycle value with each clock pulse of said modified clock signal.

6. The pulse width modulation clock control circuit according to claim 1, further comprising a counter having a clock input receiving said signal based on the clock signal and an enable input receiving said overflow signal.

7. A pulse width modulation circuit comprising a pulse width modulation clock control circuit according to claim 1 and further comprising:
at least one pulse width modulation unit comprising a duty cycle counter receiving said clock signal and said overflow signal, wherein said duty cycle counter is configured to increment a duty cycle value with each clock pulse of said clock signal unless said overflow signal is asserted.

8. A pulse width modulation clock control circuit comprising:
a clock input receiving a clock signal;
a clock driven processing unit configured to generate an overflow signal based on a scaling factor, wherein said clock driven processing unit comprises
a scaling register which is a numerator register;
an accumulator receiving said clock signal and storing an output value from an adder with each clock pulse, wherein a first input of the adder is coupled with an output of the accumulator via a multiplexer and a second input of the adder is coupled with the numerator register,
a subtractor having a first input coupled with the output of the accumulator and a second input coupled with a denominator register, wherein the multiplexer has a first input coupled with the output of the accumulator and a second input coupled with an output of the subtractor, wherein the subtractor is configured to generate the overflow signal if a subtraction of a first and second input value is less than zero and wherein the overflow signal controls said multiplexer, and wherein the pulse width modulation clock control circuit is further configured to remove a clock pulse of the clock signal or of a signal based on the clock signal when said overflow signal is generated.

9. A method for providing a pulse width modulation clock, comprising:
receiving a clock signal;
processing a scaling value with each clock and generating an overflow signal based on the scaling value; and
modifying a signal based on the clock signal by removing a clock pulse of the clock signal or the signal based on the clock signal when said overflow signal is generated, wherein modifying the signal based on the clock signal is performed by feeding the signal based on the clock signal to a counter having an enable input wherein the enable input is controlled by said overflow signal.

10. The method according to claim 9, comprising:
adding with each clock signal the scaling value with a content of an accumulator by an adder and generating the overflow signal by said adder.

11. The method according to claim 9, further comprising
receiving said clock signal and storing an output value from the adder with each clock pulse, wherein a first input of the adder is coupled with an output of the accumulator and a second input of the adder is coupled with a scaling register and wherein a carry output of the adder provides said overflow signal.

12. The method according to claim 9 and further comprising:
providing at least one pulse width modulation unit comprising the counter, wherein the counter is a duty cycle counter receiving a master clock signal based on said clock signal and said overflow signal, and
incrementing a duty cycle value with each clock pulse of said clock signal unless said overflow signal is asserted.

13. A method for providing a pulse width modulation clock, comprising:
receiving a clock signal;
processing a scaling value with each clock and generating an overflow signal based on the scaling value; and
modifying a signal based on the clock signal by removing a clock pulse of the clock signal or the signal based on the clock signal when said overflow signal is generated, wherein modifying the clock signal is performed by feeding the clock pulse to a gate controlled by the overflow signal;
feeding said clock signal to a master time base;
generating a master clock signal by the master time base, wherein the signal based on the clock signal is the master clock signal.

14. The method according to claim 13, further comprising
storing a master period value in a master period register,
counting the clock signal, and incrementing a master count value for each of the plurality of clock pulses received;
comparing the master count value to the master period value, and generating a PWM load signal when the master count value is equal to or greater than the master period value, and then resetting the master count value in the master period counter to zero, wherein the PWM load signal is the master clock signal.

15. The method according to claim 14, further comprising
Feeding the PWM load signal to a plurality of PWM generators for generating a plurality of variable frequency ratio-metric PWM signals.

16. The method according to claim 15, further comprising for each of the plurality of PWM generators:
storing a duty cycle value;
incrementing a duty cycle count value for each of the plurality of clock pulses received when the overflow signal is asserted;
comparing the duty cycle count value to the duty cycle value, and generating a phase offset related PWM signal when the duty cycle count value is less than or equal to the duty cycle value, wherein a phase offset value is loaded into the duty cycle counter to become a new duty cycle count value when the PWM load signal is asserted.

17. A method for providing a pulse width modulation clock, comprising:
receiving a clock signal;
processing a scaling value with each clock and generating an overflow signal based on the scaling value, wherein said scaling value is stored in a numerator register and wherein an output value from the adder is stored with each clock pulse, wherein a first input of the adder is coupled with an output of an accumulator via a multiplexer and a second input of the adder is coupled with the numerator register,
providing a subtractor having a first input coupled with the output of the accumulator and a second input coupled with a denominator register, wherein the multiplexer has a first input coupled with the output of the accumulator and a second input coupled with an output of the subtractor, and
generating the overflow signal if a subtraction of a first and second input value is less than zero and wherein the overflow signal controls said multiplexer; and
modifying the clock signal or a signal based on the clock signal by removing a clock pulse of the clock signal or the signal based on the clock signal when said overflow signal is generated.

18. A method for providing a pulse width modulation clock, comprising:
receiving a clock signal;
processing a scaling value with each clock and generating an overflow signal based on the scaling value; and
modifying the clock signal by removing a clock pulse of the clock signal when said overflow signal is generated, further comprising:
providing at least one pulse width modulation unit comprising a duty cycle counter receiving said modified clock signal, and
incrementing a duty cycle value with each clock pulse of said modified clock signal.

* * * * *